United States Patent [19]

Moon

[11] Patent Number: 4,538,099

[45] Date of Patent: Aug. 27, 1985

[54] AMPLIFIER CIRCUIT

[75] Inventor: Ronald R. Moon, Santa Clara, Calif.

[73] Assignee: Quantum Corporation, Milpitas, Calif.

[21] Appl. No.: 458,450

[22] Filed: Jan. 17, 1983

[51] Int. Cl.[3] ................................................ G05F 1/00

[52] U.S. Cl. .................................... 318/678; 318/677; 318/592; 330/255; 330/265

[58] Field of Search ................ 330/1 A, 1 R, 84, 275, 330/301, 255, 262, 263, 265, 77, 118, 122; 318/677, 678, 681, 687, 679, 640, 592; 323/270, 271; 363/133, 139, 124; 360/77; 310/49 R

[56] References Cited

U.S. PATENT DOCUMENTS

| | | | |
|---|---|---|---|
| 2,961,591 | 11/1960 | Franke | 318/468 |
| 3,402,342 | 9/1968 | Wagner | 323/271 |
| 3,427,520 | 2/1969 | Oppendahl | 318/678 X |
| 3,801,858 | 4/1974 | Giangaard | 323/271 X |
| 4,088,961 | 5/1978 | Ashley | 330/84 X |
| 4,169,276 | 9/1979 | Rodal | 360/77 |
| 4,189,732 | 2/1980 | Atwater | 318/681 X |
| 4,396,959 | 8/1983 | Harrison | 310/49 R |
| 4,441,081 | 4/1984 | Jenkins | 318/678 X |
| 4,490,635 | 12/1984 | Harrison et al. | 310/38 |

OTHER PUBLICATIONS

Data Sheet, TDA 2030 published by SGS-ATES Semiconductor Corp., Scottsdale, Arizona.

*Primary Examiner*—William M. Shoop, Jr.
*Assistant Examiner*—Patrick C. Keane
*Attorney, Agent, or Firm*—David B. Harrison

[57] ABSTRACT

A driver amplifier circuit for an electromechanical position translator having two coils of substantially equal inductance and resistance is disclosed. The circuit includes an input for a control voltage representing desired translator position and a reference voltage, a very low value reference resistor series connected between the two coils, differentially driven push pull amplifiers connected to drive the coils, and two equal value feedback resistors connected from the reference resistor to inverting inputs of the amplifiers, whereby absolute magnitude of output voltage equals the input voltage plus twice the reference voltage, and wherein zero differential input volts yields zero current flow through the coils.

8 Claims, 3 Drawing Figures

AMPLIFIER CIRCUIT

BACKGROUND OF THE INVENTION

The present invention relates to an electronic amplifier circuit. More particularly, the present invention relates to an improved amplifier driver circuit for driving a bidirectional electromechanical position translator having dual opposed coils.

Electromechanical position translators enjoy widespread use. One exemplary application is for positioning data transducers relative to concentric data storage tracks within rotating disk data storage equipment. In such applications, the translator may be a linear "voice coil" or it may be a rotary actuator. In either case, an electronic amplifier is required to convert electrical position information into driving current to power the translator and thereby move the data transducer to the selected data storage track, and to maintain the data transducer at the selected track during data read and write operations of the storage equipment.

Data transducer position translators in disk drives are designed to position the data transducer as rapidly as possible from one data track to another. Conventionally, the amplifiers driving such translators have applied considerable driving current thereto in order to bring about rapid change of position. Since the data track positions within the storage equipment are precisely defined and are packed very closely together to maximize storage capacity, the conventional amplifiers have been high power linear amplifiers. Such amplifiers have a number of drawbacks. One drawback is high power consumption. Another drawback is the presence of a quiescent steady-state current through the translator when it is "on track", which requires that the translator be capable of dissipating the considerable heat generated by the quiescent current.

Ideally, an amplifier for driving a position translator should be capable of a current saturation mode for applying a maximum driving current to the translator to cause it to move as rapidly as possible to a new position. The amplifier should be capable of a linear mode for providing precise increments of current to the translator to adjust it and maintain it in proper alignment at each intended position. And, the amplifier should pass no current through the translator so long as it remains in proper position. The present invention constitutes a practical realization of these ideal characteristics.

SUMMARY OF THE INVENTION

One general object of the present invention is to provide an improved amplifier driver for a dual-coil electromechanical position translator.

Another object of the present invention is to provide an amplifier driver for a position translator which passes no current through the coils thereof when the translator is aligned with its intended position, thereby minimizing heat dissipation therein and total power consumption.

A further object of the present invention is to provide an amplifier driver for a position translator which operates at a maximum current (saturated) mode to move the translator to the vicinity of a desired new position very rapidly.

Yet another object of the present invention is to provide an amplifier driver for a position translator which operates in a highly linear mode to make fine adjustments in translator position.

One more object of the present invention is to provide a simplified power amplifier circuit for an electromechanical position translator which is directly suited to digital control of the translator.

A still further object of the present invention is to provide a power amplifier circuit for a position translator which may be constructed with readily available components at low cost, and which operates economically, continuously and reliably over the useful life of the equipment containing the translator The present invention provides a driver amplifier circuit for an electromechanical position translator having two coils of substantially equal inductance and resistance. The amplifier circuit comprises:

an input node for a control voltage representing desired translator position;

a common reference voltage;

a first operational power amplifier connected between ground and supply potential and having differential inputs; a first input being connected to the common reference voltage, and a second input being connected to the input node through a first high value resistor, and having an output;

a unity gain inverter amplifier having an input connected to the input node through a second high value resistor and having an output, for inverting the sign of the voltage at the input node without change in absolute value thereof;

a second operational power amplifier connected between ground and supply potential and having differential inputs; a first input being connected to the common reference voltage, and a second input being connected to the output of the inverting amplifier through a third high value resistor and having an output, the second amplifier having the same gain as the first amplifier;

a fourth low value reference resistor connected in series between the two coils of the position translator;

one of the coils being connected to the output of the first operational power amplifier, and the other of the coils being connected to the output of the second operational power amplifier;

a fifth high value feedback resistor connected between one node of the fourth resistor and the second input of the first operational power amplifier;

a sixth high value feedback resistor connected between the other node of the fourth resistor and the second input of the second operational power amplifier.

The amplifier circuit may also advantageously include frequency compensation and overload protection elements.

Other objects, advantages and features of the present invention will be apparent from a consideration of the following detailed description of a preferred embodiment, presented in conjunction with the accompanying drawings.

DETAILED DESCRIPTION OF A PREFERRED EMBODIMENT

Figure 1:
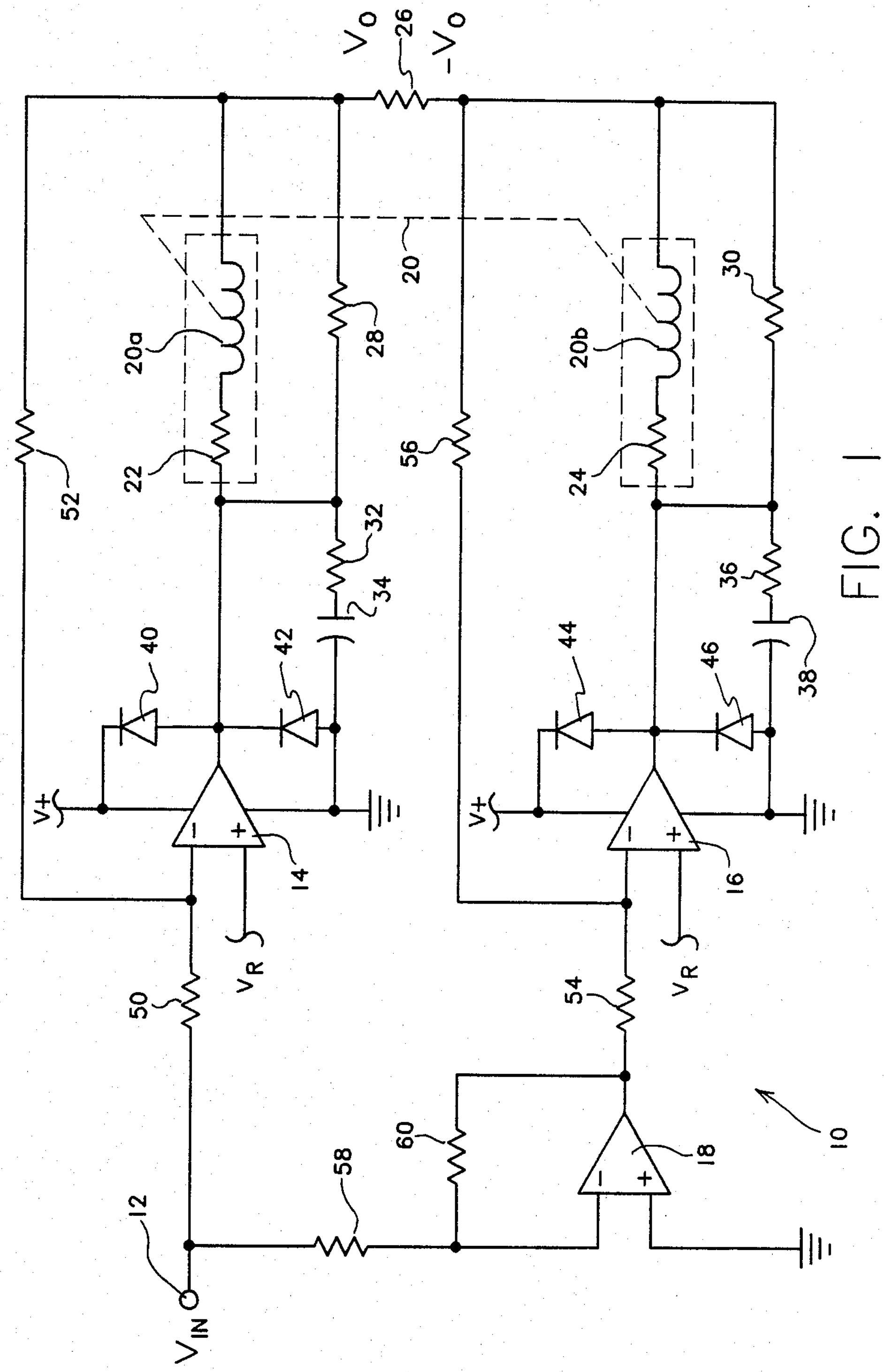
FIG. 1 is a schematic circuit diagram of the circuit of the present invention.

A circuit 10 incorporating the principles of the present invention is connected as shown in FIG. 1. The circuit 10 includes an input node 12 for receiving an input control voltage $V_{in}$. The circuit 10 includes two identical operational power amplifiers 14 and 16 and an inverter amplifier 18. The power amplifiers 14 and 16 are preferably implemented with a TDA 2030 integrated circuit audio power amplifier array, manufactured by SGS-ATES Semiconductor Corp., Scottsdale, Ariz., or equivalent. The inverting amplifier 18 is preferably a type LM 324 op amp manufactured by National Semiconductor, Santa Clara, Calif., or equivalent.

A position translator 20 has two opposed windings **20*a* and 20*b*. One form of position translator may be a disk drive rotary actuator of the type described in a U.S. Pat. Application, Serial No. 06/190,198, filed Sept. 24, 1980, now U.S. Pat. No. 4,396,959, and more particularly in its divisional, U.S. Pat. No. 4,490,635, which is commonly owned by the assignee of the present invention. The resistance component of the coil 20*a* is depicted as a series resistor 22, and the resistance component of the coil 20*b* is depicted as a series resistor 24. Each coil 20*a*, 20*b*** has a cold resistance on the order of five ohms.

A one ohm current-forcing reference resistor 26 is series connected between the coils **20*a* and 20*b*. Its significance will be discussed shortly hereinafter. Two 68 ohm shunt resistors 28 and 30 are connected in parallel across the coils 20*a* and 20*b*, respectively. The resistor 28 forms an L-R network with the coil 20*a* having a characteristic impedance of five ohms to approximately 500 Hz whereupon the impedance increases at about 6 db per octave until approximately 5000 Hz where it reaches a terminal value of 68 ohms. The same is true for the L-R network formed by the resistor 30 and coil 20*b*. At a load impedance of 68 ohms, each amplifier 14, 16** reaches a terminal gain of approximately 137.

Each amplifier 14, 16 characteristically rolls off at about 10,000 Hz (with a gain of 137). Nevertheless, because of the length of wire leads between each amplifier 14, 16 and the translator 20, high frequency stabilization of each monolithic amplifier 14, 16 is required. This stabilization is provided by an R-C network comprising a one ohm resistor 32, 36 and a 0.22 microfarad capacitor 34, 38. This network rolls the amplifier 14, 16 off at approximately 720 KHz to provide unity gain stability.

Four diodes 40, 42, 44 and 46 are provided as shown in FIG. 1 for conventional protection of the monolithic amplifiers 14, 16 atainst voltage transients appearing at the outputs thereof.

A voltage reference circuit, not shown, provides the reference voltage $V_R$. A zener diode connected in series with a resistor between ground and the power supply V+ works well as a suitable reference circuit. In the present example the reference voltage $V_R$ is six volts, and the power supply V+ is 24 volts.

Six equal high value resistors (100K ohms) 50, 52, 54, 56, 58 and 60 are connected as shown in FIG. 1. Resistors 50 and 52 establish unity gain at an output node $V_o$ and a high input impedance for the amplifier 14. Resistors 54 and 56 establish unity gain and a high input impedance for the amplifier 16. Resistors 58 and 60 establish unity gain and a high impedance for the inverting amplifier 18.

The amplifiers 14 and 16 are differentially driven. They operate linearly in the range of plus and minus one volt at the input $V_{in}$. At about one volt input the amplifiers begin to saturate, which means that the output current driven through the coils **20*a* and 20*b* remains the same as the input voltage goes beyond plus and minus one volt. The linearity of the circuit 10 is determined by the resistances of the two coils 20*a* and 20b, and the voltage drop across the amplifiers 14 and 16**. The maximum current flow reached is approximately two amperes.

According to classic theory concerning operational amplifiers configured as inverting amplifiers, such as the amplifiers 14, 16, the gain is the ratio of the feedback resistor (52, 56) to the input resistor (50, 54). Since the resistors have the same value, gain is unity in the output circuits (from $V_{in}$ to $V_o$ including the amplifiers 14, 16). Since each monolithic amplifier 14, 16 has a very high input impedance, the current through the inverting inputs (minus inputs) of the amplifiers 14, 16 is negligible. Thus, each feedback resistor 52, 56 forces the output voltage ($V_o$, $-V_o$) to be approximately the same as the input voltage $V_{in}$, since the current flowing through the feedback resistor (52, 56) is approximately the same current flowing through the input resistor (50, 54).

Figure 3:
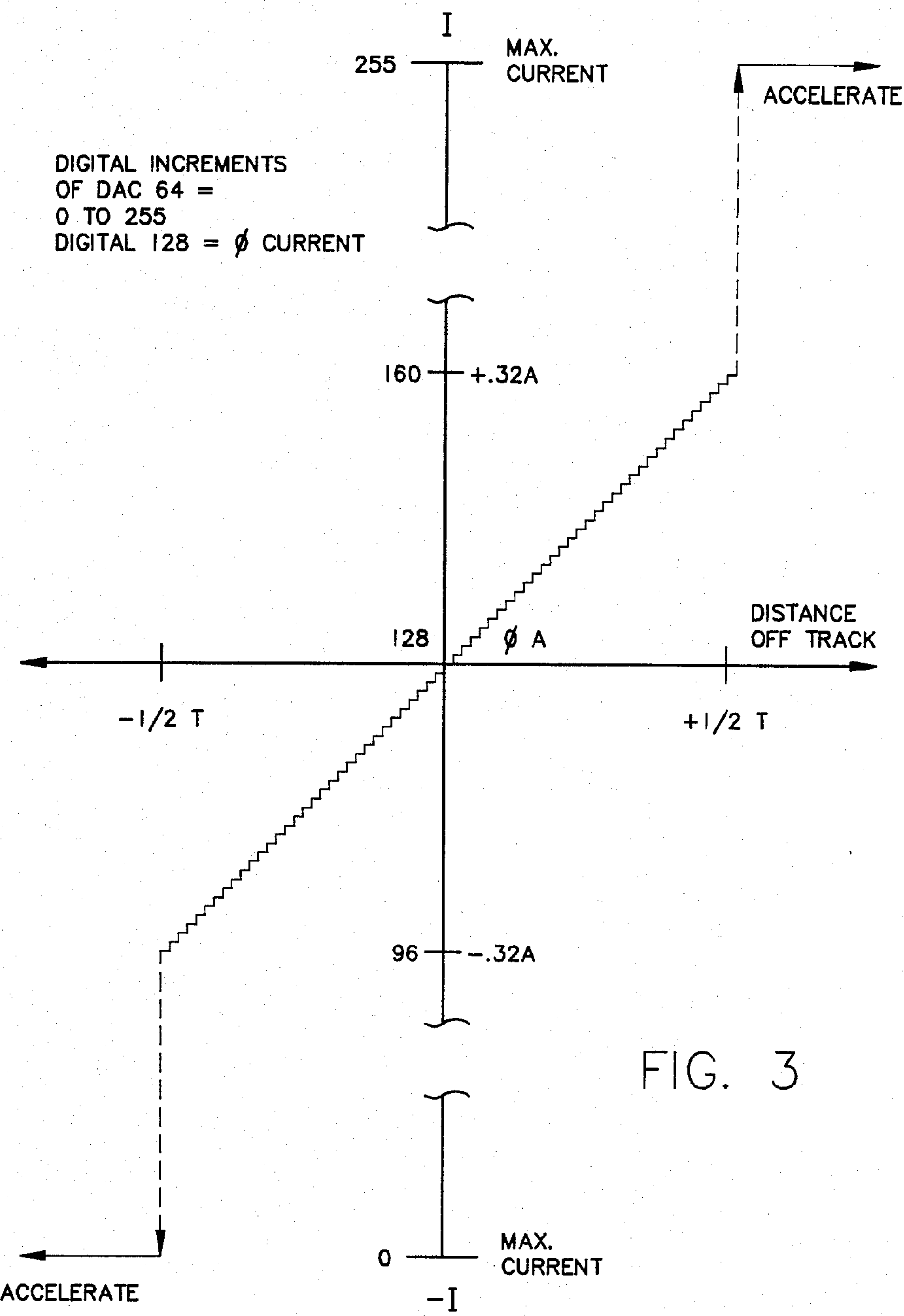
FIG. 3 is a graph of translator position plotted against coil current.

Whatever current is required to maintain the output at the same voltage as the input will flow through the forcing resistor 26, and also the coils **20*a* and 20*b*. For example, suppose the input voltage $V_{in}$ is plus one half volt. One ampere of current will flow from V+, through the second amplifier 16, through coil 20*b*, through the forcing resistor 26, through coil 20*a*, through the first amplifier 14 to ground. At 0.25 V, the current flowing will be 0.5 amp. At zero input volts, no current flows. FIG. 3** charts the current flow relative to desired translational position change.

Figure 2:
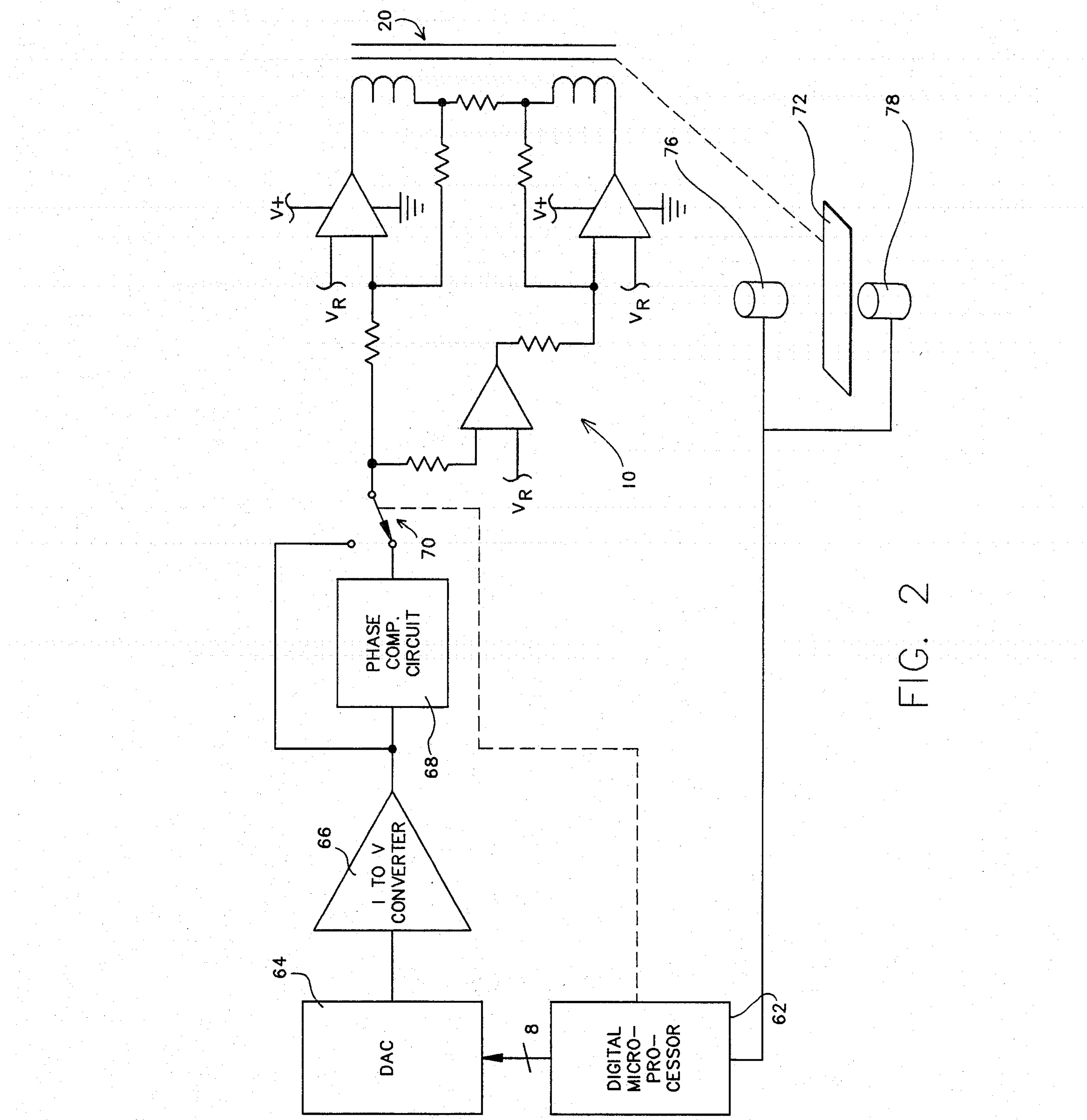
FIG. 2 is a block diagram of a servo system incorporating the circuit of the present invention.

One application for the amplifier 10 is to drive a data transducer position actuator in a rotary disk drive. A simplified digital servo system is depicted in FIG. 2. Therein, a programmed digital microprocessor 62 puts out digital current values to a digital to analog converter 64. The converter 64 converts the digital values to analog current steps. These current steps are converted to analog voltage steps by a current to voltage converter 66. A servo loop phase compensation circuit 68 provides required lead-lag servo loop compensation to the voltage values.

A switch 70, operated digitally by the microprocessor 62, selects the input voltage $V_{in}$ from either the phase circuit 68 or directly from the current to voltage converter 66, depending upon whether incremental adjustment is commanded during on-track centerline correction operations or whether a track-seek full current movement is commanded.

The translator 20 is mechanically linked to a position feedback sensor, such as an optical encoder comprising a scale 72, light source 76 and photodetector array 78 connected to the input of the microprocessor. Actual translator position is read by the optical encoder and communicated to the microprocessor 62. The microprocessor calculates digital voltage values which ultimately are applied to the circuit 10 to power the translator 20. If the calculated values are below plus and minus one volt, the circuit 10 passes a linearly proportional current through the coils **20*a* and 20*b***.

If the calculated values exceed one volt, then a maximum current passes through the coils. For example, if three amperes of current are commanded to pass through the coils, their resistances (approximately five ohms (cold) limit the maximum current to approximately two amperes (with a 24 volt supply). The minimum current put out by the amplifiers 14, 16 must be sufficient to yield an acceleration of the position actuator above a minimum acceleration value followed by the processor 62 by reference to a digital stored acceleration look-up table.

When the input voltage $V_{in}$ equals zero volts, no current passes through the coils 20*a* and 20*b*, which means that they dissipate no heat unless and until the microprocessor 62 commands the translator 20 to move by generating a digital value ultimately appearing as a voltage differential $V_{in}$ at the input 12.

Having thus described a presently preferred embodiment of the present invention, it will now be appreciated that the objects of the invention have been fully achieved, and will be understood by those skilled in the art that many changes in construction and circuitry and widely differing embodiments and applications of the invention will suggest themselves without departure from the spirit and scope of the invention. The disclosures and the description herein are therefore purely illustrative and are not intended to be in any sense limiting.

I claim:

1. A driver amplifier circuit for an electromechanical position translator having two low impedance coils of substantially equal inductance and resistance, said amplifier circuit comprising input means for providing a control voltage $V_{in}$ and for providing a control voltage $-V_{in}$ representing desired translator position;

said two coils being series connected, and a very low ohmic value reference resistor connected in series between said coils to form a $+V_{out}$ node and a $-V_{out}$ node, a pair of differentially driven push pull amplifier means connected between ground and supply potential, one of said pair having an input connected to said $+V_{in}$ voltage and to a reference source voltage $V_{ref}$ and the other of said pair having an input connected to said $-V_{in}$ voltage and to said reference source voltage $V_{ref}$ and having outputs connected to drive said coils, one of said pair connected to one of said coils and the other of said pair connected to the other of said coils;

two equal, high ohmic value feedback resistors, one thereof being connected from said $+V_{out}$ node to an inverting input of one of said amplifier pair and the other thereof being connected from said $-V_{out}$ node to an inverting input of the other of said differentially driven push pull amplifier pair means;

whereby current passing through said coils is substantially proportional to said input control voltage within a range of linearity and operating frequency of said circuit.

2. A driver amplifier circuit for an electromechanical position translator having two coils of substantially equal inductance and resistance, said amplifier circuit comprising:

an input node for a control voltage;

a common reference voltage;

first push pull amplifier means connected between ground and supply potential and having differential inputs with a non-inverting input being connected to said common reference voltage and an inverting input being connected to said input node through a first resistor and having an output;

unity gain inverter amplifier means having an input connected to said input node through a second resistor and having an output, for inverting the sign of the voltage at said input node without change in absolute value thereof;

second push pull amplifier means connected between ground and supply potential and having differential inputs with a non-inverting input being connected to said common reference voltage and an inverting input being connected to said output of said inverting amplifier means through a third resistor and having an output;

a fourth reference resistor connected in series between said two coils;

one of said coils being connected to the output of said first operational amplifier means, and the other of said coils being connected to the output of said second operational amplifier means;

a fifth feedback resistor connected between one node of said fourth resistor and said inverting input of said first amplifier means;

a sixth feedback resistor connected between the other node of said fourth resistor and said inverting input of said second amplifier means.

3. The amplifier circuit set forth in claim 2 wherein said first, second, third, fifth and sixth resistors are of equal value.

4. The amplifier circuit set forth in claim 2 wherein said fourth resistor has an ohmic value substantially equal to one ohm.

5. The amplifier circuit set forth in claim 3 wherein said first, second, third, fifth and sixth resistors each have an ohmic value substantially equal to 100,000 ohms.

6. The amplifier circuit set forth in claim 2 further comprising two pairs of output protection diodes connected in reverse biased series between ground and supply voltage, with the common node thereof being directly connected to the output of said first and second power amplifier means.

7. The amplifier circuit set forth in claim 2 further comprising seventh and eighth resistors, said seventh resistor connected in parallel across one of said coils and said eighth resistor connected in parallel across the other of said coils so as to limit high frequency impedance at the outputs of said first and second amplifier means.

8. The amplifier circuit set forth in claim 2 further comprising low pass filter means connected to the output of each of said first and second amplifier means in order to limit the high frequency bandwidth thereof to a predetermined low frequency range.

* * * * *